(12) United States Patent
Lahiri et al.

(10) Patent No.: US 6,385,762 B1
(45) Date of Patent: May 7, 2002

(54) DATA REDUCTION USING RANK-OF-RANKS METHODOLOGY

(75) Inventors: Santi B. Lahiri, Winchester; John A. Klashka, North Andover, both of MA (US); David Marshall Fredericksen, Hudson, NH (US); Walter D. Shine, Salisbury, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/337,361

(22) Filed: Jun. 21, 1999

(51) Int. Cl.[7] .............................................. G06F 17/50
(52) U.S. Cl. ...................................................... 716/10
(58) Field of Search ............................... 705/8; 716/10, 716/2, 4

(56) References Cited

U.S. PATENT DOCUMENTS 6,151,582 A * 11/2000 Huang ............................ 705/8
6,223,332 B1 * 4/2001 Scepanovic ................... 716/10

OTHER PUBLICATIONS

"Building Empirical Models", Chapter 6, pp. 275–293.

* cited by examiner

Primary Examiner—Matthew Smith
Assistant Examiner—Thuan Do
(74) Attorney, Agent, or Firm—Brian L. Michaelis; Brown Rudnick Berlack Israels

(57) ABSTRACT

Data reduction for testing results obtained from the diagnostic testing of signal integrity at node points along a PC board using a Rank-of-Ranks data analysis methodology. The Rank-of-Ranks methodology including a reduction of node points along the PC board by the application of a node point reduction algorithm. Calculating a ratio of the Standard Deviation by the Mean for each node point and for each testing parameter to arrive at a Coefficient of Variation. Each node point is sorted and ranked based on the Coefficient of Variation for each tested parameter at a time. At each node point, Rank values of all the parameters are summed and then sorted on the basis of the Rank values. The node points are Re-ranked based on the sorted Rank values. The Re-ranked node points are entered into an ordered list or matrix where critical node points are chosen from the top of the Re-ranked node points for study, re-design and/or further testing of the PC board.

19 Claims, 7 Drawing Sheets

| Active | | Low | | High | | | Indictment Levels | |
|---|---|---|---|---|---|---|---|---|
| ☑ | RTime | ◀▶ | 0.00E+0 | ◀▶ | 20.00E-9 | > | ◀▶ | 6.00E-9 |
| ☑ | VMax | ◀▶ | 0.00E+0 | ◀▶ | 8.00E+0 | > | ◀▶ | 6.00E+0 |
| ☑ | VTop | ◀▶ | 0.00E+0 | ◀▶ | 8.00E+0 | > | ◀▶ | 6.00E+0 |
| ☑ | PreShoot | ◀▶ | 1.00E+0 | ◀▶ | 150.00E+0 | > | ◀▶ | 100.00E+0 |
| ☑ | OverShoot | ◀▶ | 1.00E+0 | ◀▶ | 150.00E+0 | > | ◀▶ | 100.00E+0 |
| ☑ | FTime | ◀▶ | 0.00E+0 | ◀▶ | 20.00E-9 | > | ◀▶ | 6.00E-9 |
| ☑ | VMin | ◀▶ | 5.00E+0 | ◀▶ | 2.50E+0 | < | ◀▶ | 1.00E+0 |
| ☑ | VBase | ◀▶ | 5.00E+0 | ◀▶ | 2.00E+0 | < | ◀▶ | 1.00E+0 |
| ☑ | PreShoot | ◀▶ | 1.00E+0 | ◀▶ | 150.00E+0 | > | ◀▶ | 100.00E+0 |
| ☑ | OverShoot | ◀▶ | 1.00E+0 | ◀▶ | 150.00E+0 | > | ◀▶ | 100.00E+0 |
| ☑ Test for Glitches | | | | | | | | |

SAVE SETTINGS

FIG. 2

Board Name :
Test Started : Thu 22/Oct/1998;16:52:26

Parameter;ON/OFF;Low Def;High Def;Low Filter;High Filter;Indite Level
Rise Time:;1;1;2;0;1.2E-008;6E-009
Fall Time: ;1;1;2;0;1.2E-008;6E-009
PreShoot: ;1;0;0;-1;150;100
OverShoot: ;1;0;0;-1;150;100
Base Voltage: ;1;0;0;-5;2;-1
Top Voltage: ;1;0;0;0;8;7
Min Voltage: ;1;0;0;-5;2.5;-1
Max Voltage: ;1;0;0;0;8;7

Glitch Params;OFF/ON;Rising Lev;Falling Lev;Wait Time;Time Base;Width;Indite NO/YES;Filter NO/YES
Glitch;1;1;2;0.5;1E-008;3E-009;1;1

Min Readings = 100;trigger Mode = 0;Min Iterations = 1;IterationTimeFlag = 0

Rise Time;Fall Time;PreShoot;OverShoot;Base Voltage;Jitter;Max Voltage;Min Voltage;inditeR,inditeF,inditeCP,inditeGP,inditeGN,inditeJit,triggerRT
22/Oct/1998;16:55:19;B7_32.185VIA;XIO1BS1 ;147;1.0075E-009;1.3271E-009;6.38949E-011;100;9.052E-010;1.0669E-009;9.73699E-010
22/Oct/1998;16:57:39;D7_31.185VIA;XIO1BS1 ;147;1.5649E-009;1.8395E-009;1.70602E-009;4.9764E-011;100;1.2093E-009;1.28909E-009
22/Oct/1998;17:00:10;T7_41.185VIA;YIO1BS1 ;147;9.069E-010;1.1827E-009;1.04755E-009;5.40888E-011;100;8.364E-010;1.0059E-009;9.18006E-010;
22/Oct/1998;17:03:09;Q7_42.185VIA;YIO1BS1 ;147;1.3551E-009;1.5776E-009;1.46993E-009;4.85285E-011;100;1.1468E-009;1.3234E-009;1.21063E-00
22/Oct/1998;17:06:17;D22_10.109VIA;XIO1BS1 ;147;1.2558E-009;3.0348E-009;2.30486E-009;6.19328E-010;100;9.275E-010;1.898E-009;1.19342E-009
22/Oct/1998;17:09:16;B22_10.56VIA;XIO0AB7 ;147;1.3491E-009;2.7404E-009;2.48341E-009;2.74018E-010;100;9.023E-010;1.7707E-009;9.79356E-010
22/Oct/1998;17:12:20;M17_21.199VIA;PWRBUS3 ;147;1.83E-009;2.4377E-009;1.94653E-009;6.2674lE-011;100;9.295E-010;1.0869E-009;1.0163E-009;3
22/Oct/1998;17:13:36;M17_21.88VIA;SLOWAB2 ;3;2.9478E-009;8.2134E-009;5.1705E-009;2.72694E-009;50;1.8545E-009;2.9874E-009;2.38312E-009;3.
22/Oct/1998;17:14:37;M17_21.86VIA;SLOWAB4 ;5;3.5254E-009;1.14943E-008;8.32296E-009;3.17832E-009;50;2.17B4E-009;3.3875E-009;2.61681E-009;
22/Oct/1998;17:17:36;B22_10.50VIA;XIO0AB11 ;148;1.0411E-009;1.3655E-009;1.18212E-009;7.45772E-011;100;8.991E-010;1.1458E-009;1.00004E-00

VBVAR

| PROBEPOINT | SIGNAME | BASEVAR | BASEVAR_RANK |
|---|---|---|---|
| P20_25.3VIA | SLOWAB17 | 89.07 | 1 |
| L7_79.98VIA | YSDIO22 | 55.28 | 2 |
| E22_01.11VIA | XMPD23 | 40.61 | 3 |
| L7_79.74VIA | YSDIO5 | 35.20 | 4 |
| T7_41.142VIA | YMDB14 | 29.31 | 5 |
| P22_25.20VIA | SLOWDB14 | 21.43 | 6 |
| M20_24.31 | SLOWAB17 | 11.28 | 7 |
| L22_23.21VIA | SLOWDB15 | 9.52 | 8 |
| L20_23.18VIA | SLOWDB20 | 8.99 | 9 |
| D18_05.51VIA | SLOWDB10 | 8.50 | 10 |
| D2_33.92VIA | XSCSD7 | 7.21 | 11 |
| Z18_15.48VIA | YMDB4 | 6.65 | 12 |
| L7_79.76VIA | YSDIO7 | 6.58 | 13 |
| M22_24.18 | SLOWDB12 | 6.42 | 14 |
| P23_25.30VIA | SLOWAB19 | 6.06 | 15 |
| M20_24.2 | SLOWAB18 | 5.70 | 16 |
| D18_05.44VIA | SLOWDB15 | 5.55 | 17 |
| D7_31.221VIA | XSDIO26 | 5.04 | 18 |
| P23_25.3VIA | SLOWAB17 | 4.76 | 19 |
| M22_24.15 | SLOWDB10 | 4.75 | 20 |
| G7_83.78VIA | XSDIO9 | 4.69 | 21 |
| D2_33.97VIA | XSCSD2 | 4.50 | 22 |
| P20_25.2VIA | SLOWAB18 | 3.97 | 23 |
| G7_83.75VIA | XSDIO6 | 3.60 | 24 |
| L7_79.75VIA | YSDIO6 | 3.54 | 25 |
| L23_23.19VIA | SLOWDB5 | 3.50 | 26 |
| D7_31.236VIA | XSDIO9 | 3.31 | 27 |
| P22_25.21VIA | SLOWDB15 | 3.24 | 28 |
| D7_31.74VIA | XSDIO7 | 3.18 | 29 |
| P22_25.18VIA | SLOWDB12 | 3.16 | 30 |
| D7_31.72VIA | XSDIO5 | 3.05 | 31 |
| M22_24.31 | SLOWAB17 | 2.92 | 32 |
| T2_45.95VIA | YSCSD4 | 2.90 | 33 |
| G7_83.94VIA | XSDIO19 | 2.88 | 34 |
| D7_31.235VIA | XSDIO10 | 2.77 | 35 |
| M22_24.21 | SLOWDB15 | 2.75 | 36 |
| M23_24.18 | SLOWDB4 | 2.68 | 37 |
| W18_15.33VIA | SLOWDB15 | 2.68 | 38 |
| H4_51.5VIA | ADU_BUS9 | 2.63 | 39 |
| Q7_42.100VIA | YSDIO39 | 2.62 | 40 |
| J7_84.75VIA | XSDIO38 | 2.57 | 41 |
| L22_23.18VIA | SLOWDB12 | 2.51 | 42 |

FIG. 5

DATA REDUCTION USING RANK-OF-RANKS METHODOLOGY

TECHNICAL FIELD

The present invention relates generally to the field of data reduction, and more particularly to data reduction using a data analysis methodology.

BACKGROUND OF RELATED ART

The fabrication of printed circuit (PC) boards and related electrical equipment requires the diagnostic testing of performance factors or parameters including voltage and signal deviations, jitters, voltage rise and fall time and other signal integrity factors. The testing of these parameters helps identify anomalous data points from which a problem or failure in the PC board can be determined. Known testing methods of signal integrity in the manufacture of PC boards includes identifying probe or node points from a schematic or CAD layout of the PC board. These node points are located throughout the entire PC board in areas surrounding components, drivers, voltage points and the like and represent points of contact on the PC board.

The number of node points incorporated throughout a PC board can be large; consequently, raising the level of complexity required to perform any type of statistical or data related analysis of the testing results (raw data) obtained from the PC board. Additionally, these results include varied unit designations, such as, voltage, amperage, inductance, capacitance and time readings which further complicate data analysis of the results obtained from the diagnostic testing of the node points.

Once the node points of the PC board are tested and the results (raw data) are obtained, statistical analysis of the data is required in order to ascertain any problem or anomalous data which may indicate problem or defective areas in the PC board. Further, the large amounts of raw data often must be statistically processed in order to emphasize a small subset of data that may be useful to engineering personnel using the data to assess behavioral characteristics of circuitry on the PC board. To this end, there are many methods of performing statistical analysis on data including multiple regression and factor analysis. In using multiple regression, see, for example, Engineering Statistics by Douglas C. Montgomery et al., no ideal data model can be extrapolated due to the varied units which prevents quantitative aggregation of the raw data in a useful model form. The use of other known statistical factor analysis methods presents similar problems in consistently presenting guidelines for discerning problems at the node points.

SUMMARY

The present invention provides a method and apparatus for performing data reduction to results of diagnostic testing of signal integrity of PC boards using a Rank-of-Ranks data analysis methodology. Raw data obtained from the diagnostic testing of signal integrity at node points situated on PC boards is manipulated to a succinct form using the Rank-of-Ranks data analysis methodology.

According to the invention, the Rank-of-Ranks methodology includes an initial reduction of the quantity of analyzed node points on a PC board, by application of a node point reduction algorithm or selection criterion. The remaining node points to be tested ("the test nodes"), each are identified by a node name and associated node position in (x-y-z) coordinate system. The test nodes are physically tested via a testing probe positioned on the end of a robot which moves along the node position coordinates. The testing at each node point includes sample measurements of selected testing parameters or factors. Standard Deviations and Mean are calculated for each selected testing parameter. All test data is compiled at a server and input into a spreadsheet for data manipulation using the Rank-of-Ranks methodology.

Data manipulation using the Rank-of-Ranks methodology according to the present invention includes calculating a Coefficient of Variation as a ratio of the Standard Deviation of a given factor, to the Mean, for each node point (and for each parameter). Each node point is sorted and ranked based on the Coefficient of Variation for each parameter at a time. At each node point, Rank values of all the parameters are summed and then sorted on the basis of the Rank values. Finally, the node points are Re-ranked based on the sorted Rank values. The Re-ranked node points are entered into an ordered list or matrix where critical node points are chosen from the top of the Re-ranked node points for study, re-design and/or further testing of the PC board.

Advantages of the present invention include reduction of node points involved in the testing of PC boards which allow the testing procedures to be more focused and to require less time thereby greatly increasing productivity and lowering manufacturing costs. Also, diagnostic testing of the PC boards can be targeted to include certain critical and control state node points.

BRIEF DESCRIPTION OF THE DRAWINGS

The invention will be more fully understood from the following detailed description taken in conjunction with the accompanying drawings in which:

FIG. 2 is a view illustrating a graphical user interface for selecting parameters to be measured for input into the data reduction methodology according to FIG. 1;

FIG. 5 is a view of a printout of data results after applying the Rank-of-Ranks methodology according to the present invention.

DETAILED DESCRIPTION

The following discussion includes an illustrative description of PC boards and related manufacturing and testing procedures utilized in testing PC boards followed by a description of a method of applying test results to a data reduction technique, that is, Rank-of-Ranks methodology, for simplifying and obtaining critical and anomalous areas of concern with respect to the design of the PC boards.

Figure 1:
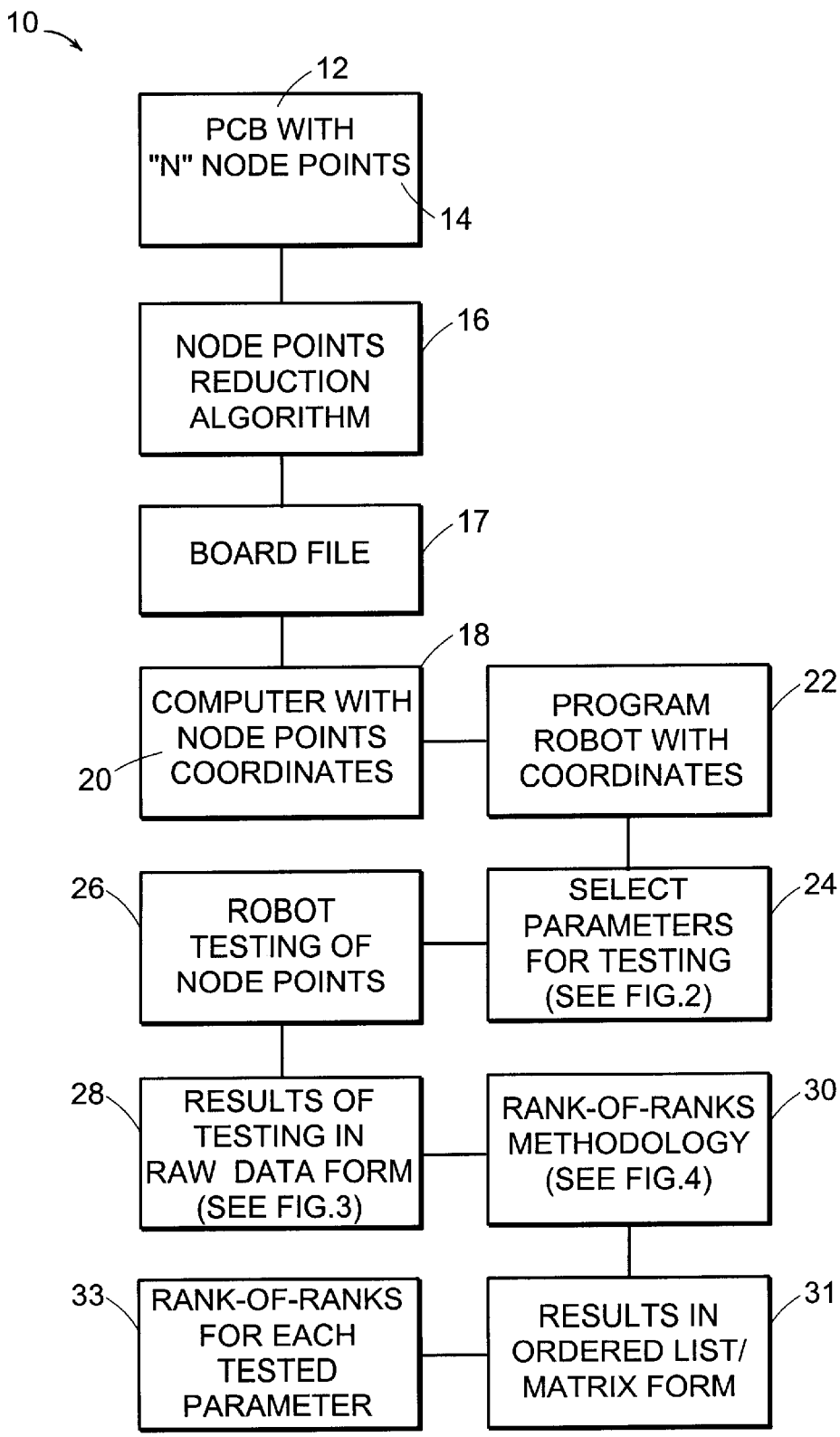
FIG. 1 is a block diagram illustrating the method of data reduction methodology according to the present invention.

Reference will now be made in detail to the embodiments of the disclosure, which are illustrated in the accompanying figures. FIG. 1 outlines a data reduction methodology 10 as applied to the diagnostic testing of PC boards. Initially, a schematic diagram of a PC board design is downloaded to or designed on a typical computer aided design system (CAD), such as Allegro available from Cadence. The schematic diagram in the form of electrical and component interconnections is transferred into computer and database files including board files which have nodes corresponding to probe points 14 along the PC board 12, identified as x, y and z coordinates. These node points 14 are located throughout the PC board 12 at areas interconnecting components, drivers, voltage points, ground points and the like. A typical PC board 12, may include between 4000 and 6000 node points 14. Each node point 14 typically represents a contact point for testing and is represented in a board layout database by name, coordinates (x-y-z), designators and other pertinent information as will be described hereinafter.

The initial unreduced or total set number of node points 14 typically attributable to PC boards 12 produces a vast amount of data during the testing thereof. In an effort to reduce such data to a useful and manageable number, the data reduction methodology 10 according to the present invention applies a node point reduction algorithm 16 or criterion for reducing the number of nodes to be tested. The node point algorithm 16 is devised to target the most important specific points of interest for testing signal integrity of the PC board 12. The algorithm 16 involves establishing all probable node points 14 as a universal board file 17. The node points 14 of greatest interest are in electrical proximity to a component of the PC board 12. The node points 14 of less interest, and dismissed from testing according to selection criterion, are node points 14 including ground or voltage points, driver outputs and points associated with discrete components (such as pull-up or pull-down resistors or decoupling capacitors or the like). The resulting subset or reduced quantity of node points 14, which include multistate points that may be subject to further optimization, are targeted for diagnostic testing by a computer 18 controlled robot 22 such as a Proteus™ DVT 100. The subset of node points established represent points that have the highest likelihood of presenting worst case characteristic.

Once the subset is established, i.e. the reduced number of node points 14 are chosen, the requisite node information 20 such as node name, coordinates (x-y-z), node and board side designators, associated ground locations and the like are relayed via a database file to a control computer 18 having user interfaces 50 which in turn control the Proteus™ robot 22 during the diagnostic testing procedures.

As illustrated in FIG. 2, prior to the physical testing of the PC board 12, a user enters desired testing parameters 24 through the user interface 50 for selective testing at the node points 14. The selectable parameters 24 include electrical characteristics such as rise time, fall time, preshoot, overshoot, base voltage, top voltage, minimum voltage, maximum voltage and the like as is known in the art.

During robot testing 26 of PC board 12, the robot 22 locates each node point 14 by its requisite information 20 and correspondingly moves its robotic arm to coordinates (x-y-z) corresponding to each node point 14 in the database board file 17. Measurements taken by the Proteus™ robot 22 are performed through the use of a robotic arm (not shown) carrying testing equipment such as an oscilloscope probe for a Tektronix TVS 625 oscilloscope, or similar equipment as is known in the art. Resulting measurements of the selected parameters 24 are taken over time as an equal number or by the number of iterations of host scripts. The number of measurements performed for each parameter 24 at each node point 14 can vary dependent upon the desired testing criterion.

Figures 3, 3A:
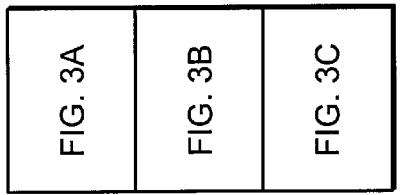
FIG. 3 is a view of a printout of measured results of data prior to applying the Rank-of-Ranks methodology according to the present invention.
Figure 3C:
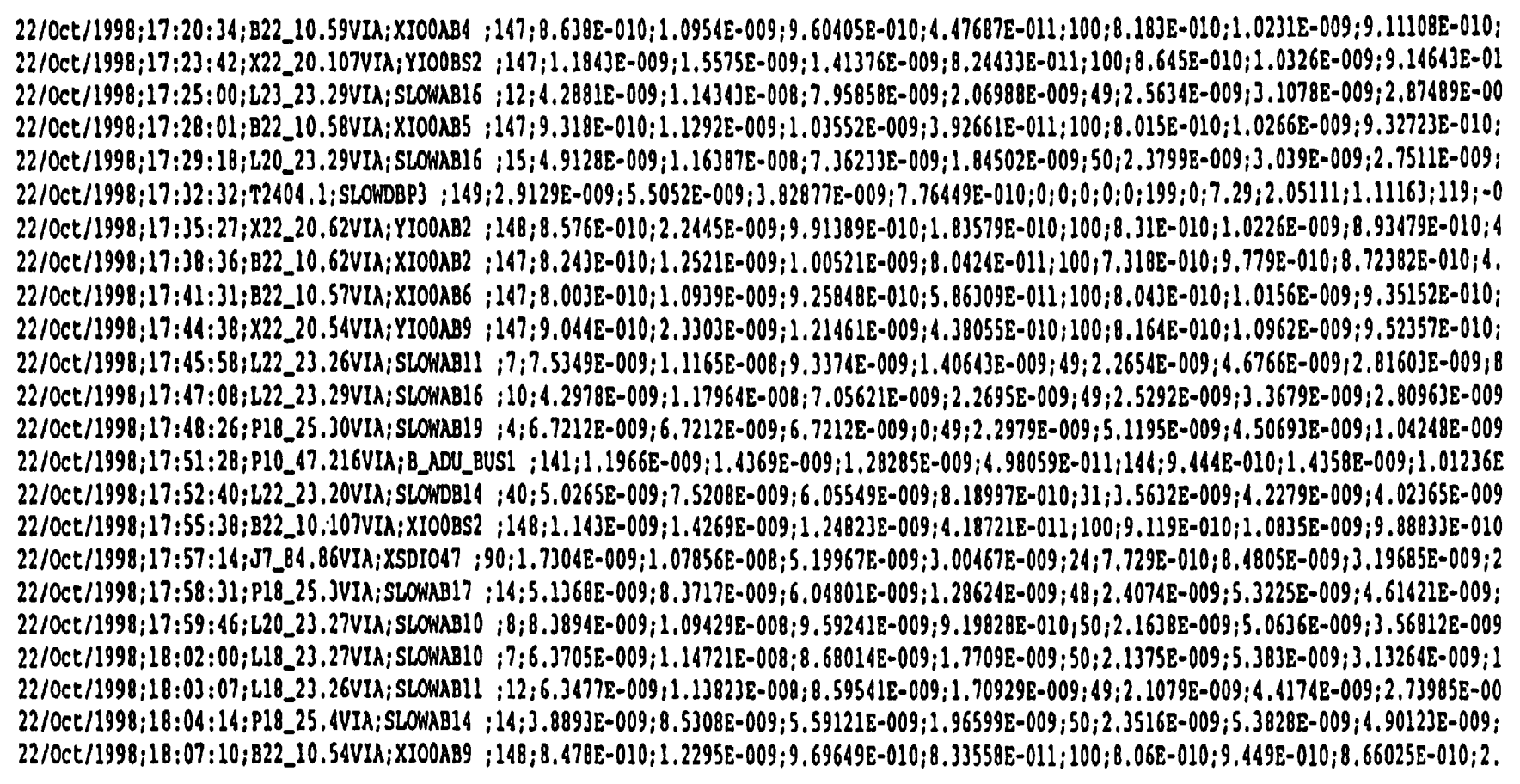

With reference to FIG. 3, resulting data 28 from the robot testing 26 is formatted in ASCII which allows the data 28 to be transferred via a local IEEE 488 bus to a server (not shown) for data handling and manipulation. Due to the number of node points 14 and the iterative series of tests of parameters 24 at each of the node points 14, the resulting data 28 may be quite voluminous. The resulting data 28 is manipulated using typical tools, e.g., Lotus™ or Excel™, into a user readable format such as in a spreadsheet 60. However, the resulting data 28, as depicted on the spreadsheet 60 is difficult to read. The volume of data makes problem identification difficult, and the general format does not clearly present parameter 24 testing conclusions with respect to individually tested node points 14. Therefore, by way of the present invention, the voluminous data 28 as represented in the spreadsheet 60 is reduced to a more concise, meaningful and effective format.

Figure 4:
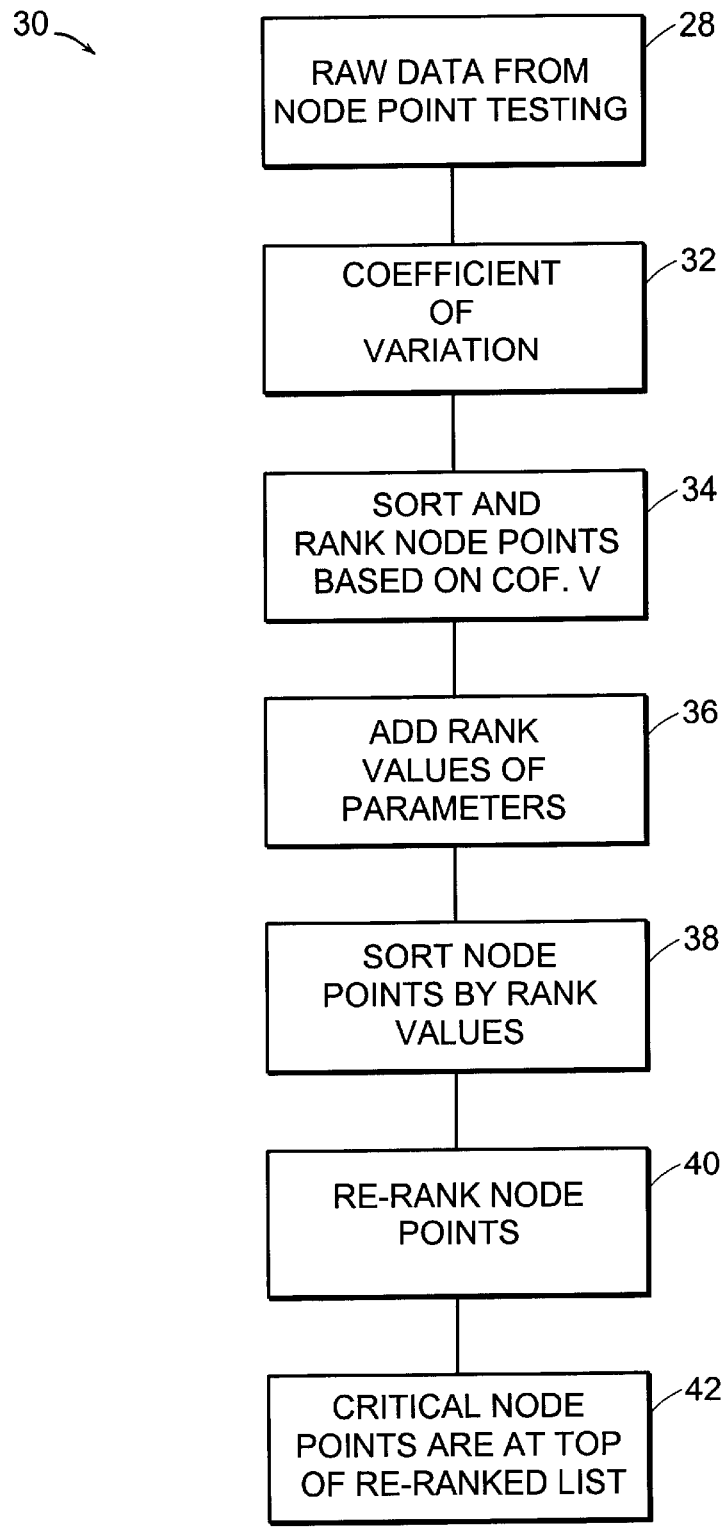
FIG. 4 is a block diagram illustrating data reduction using the Rank-of-Ranks methodology according to the present invention.

Accordingly, as illustrated in FIGS. 1 and 4, a Rank-of-Ranks data reduction methodology 30 is applied to the data results 28. A flow diagram in FIG. 4 depicts the Rank-of-Ranks methodology 30 for the data results 28. This methodology 30 first involves calculating the Standard Deviation and Mean for each parameter 24 at each node point 14. At each node point 14 and for each tested parameter 24, a ratio, in the form of a Coefficient of Variation 32, is calculated by dividing the Standard Deviation by the Mean. The Coefficient of Variation 32 for each node point 14 represents a level of criticality for that node point 14 as compared to other tested node points 14, in that, node points 14 having a higher Coefficient of Variation 32 value represent node points 14 which are more critical than node points with lower Coefficient of Variation 32 values. In addition, a node point 14 having a higher Coefficient of Variation 32 value possesses a greater probability of possessing an irregularity as compared to node points 14 having a lower Coefficients of Variation 32 value. Each node point 14 is then sorted and ranked 34 based on the Coefficient of Variation 32 values for each parameter 24 at a time.

The next step involves adding Rank values 36 for all the parameters 24 to where the lowest Rank value 36 corresponds to node points 14 having the highest Rank-of-Ranks 30 value. The node points 14 are then sorted 38 on the basis of the Rank values 36. Finally, the node points 14 are Re-ranked 40 based on the sorted Rank values 38. The Re-ranked node points 40 are entered into an easily readable format such as an ordered list or matrix 31 where critical node points 42 are chosen from a top portion of the Re-ranked node points 40 for study or further testing of the PC board 12.

With reference to FIG. 5, an example results listing 33 is illustrated disclosing ranked node points 14 using the Rank-of-Ranks methodology 30 according to the present invention. The resulting matrix 31 includes the Rank-of Ranks listing 33 for a base voltage parameter 24 as tested on node points 14. The listing 33 includes a ranked consecutive listing of the most critical node points 14 resulting from the testing of the base voltage parameter 24 wherein a Rank-of Ranks value of one (1) represents a node point 14 with more criticality than a Rank-of-Ranks value of two (2) and so on down the listing 33. Therefore, based on the values of the Rank-of-Ranks listing 33, a user can easily identify the node points 14 which present a probability of higher criticality or irregularity as to the tested parameters 24.

The embodiments of the apparatus and methods disclosed herein are discussed in terms of diagnostic testing and measurement analysis for PC boards. It is envisioned, however, that the disclosure is applicable to a wide variety of electrical components and instrumentation, including but not limited to, processors, computer chips, drivers, switches and the like.

While the illustrative embodiments provided herein refer to data analysis on parameters 24 associated with PC boards 12, it should be understood by those familiar with data regression that the Rank-of-Ranks methodology could be employed in any of various areas where complex or voluminous data is to be refined to a more succinct and understandable format.

Although the initial node reduction algorithm 16 serves to simplify the complexity of the final ordered list or matrix 31 and resulting Rank-of-Ranks listing 33 it should be appreciated that it is not required in order to properly apply the Rank-of-Ranks methodology 30 according to the present invention. To that extent, the Rank-of-Ranks methodology 30 effectively operates with virtually any number of node, data or testing points While particular electrical characteristics are described herein for testing at the node points, it should be appreciated that characteristics other than those particularly recited could be tested and analyzed according to the method and apparatus of the invention.

Although the invention has been shown and described with respect to an exemplary embodiment thereof, various other changes, omissions and additions in the form and detail thereof may be made therein without departing from the spirit and scope of the invention.

What is claimed is:

1. A method for performing data reduction on a set of node point data, comprising the steps of:
    obtaining a set of raw data representing a plurality of node points:
    testing each of said plurality of node points by taking sample measurements of a plurality of selected testing parameters;
    computing a standard deviation and mean for each of said sample measurements for each of said plurality of selected testing parameters;
    calculating a Coefficient of Variation for each of said plurality of selected testing parameters as a ratio of the standard deviation of a selected testing parameter to the mean for the selected testing parameter, for each node point; and
    sorting and ranking each selected testing parameter based on the Coefficient of Variation for each parameter.

2. The method of claim 1 wherein said methodology further includes an initial reduction step performed before the testing step wherein the quantity of analyzed node points, and a corresponding amount of raw data, are reduced by application of node point reduction selection criterion.

3. The method of claim 2 wherein the plurality of node points are located on a Printed Circuit Board and the initial reduction step involves applying selection criterion that eliminates from testing selected node points including at least one of ground points, voltage points, driver outputs and points associated with discrete components.

4. The method of claim 1 further including the step of summing the rank values at each node point of all the plurality of selected testing parameters, then sorting the plurality of selected testing parameters on the basis of summed rank value.

5. The method of claim 4 further including the step of entering the sorted and ranked plurality of selected testing parameters into an ordered list with critical node points located at the top of the ordered list.

6. The method of claim 1 wherein the plurality of node points are located on a Printed Circuit Board (PCB) and each of said plurality of node points is identified by a node name and associated node position in an x-y-z coordinate system.

7. The method of claim 6 wherein the step of testing involves the plurality of node points being physically tested by a probe positioned on a robot which moves along the plurality of node points as a function of respective position in the x-y-z coordinate system.

8. The method of claim 1 wherein said set of raw data is obtained from diagnostic testing of signal integrity at node points situated on at least one PC board.

9. The method of claim 8 wherein the selected testing parameters include at least one of rise time, fall time, preshoot, overshoot, base voltage, top voltage, minimum voltage, and maximum voltage.

10. An apparatus for performing data reduction to results of diagnostic testing of signal integrity on a Printed Circuit Board (PCB), comprising:
    a first processor receiving a set of raw data representing a plurality of node points on said PCB, said processor performing an initial reduction wherein the quantity of said plurality of node points, and a corresponding amount of raw data, are reduced by application of node point reduction selection criterion to provide a reduced plurality of nodes identified by respective node names and associated node positions in an x-y-z coordinate system relative to the PCB;
    a robot receiving said reduced plurality of nodes identified by respective node names and associated node positions in an x-y-z coordinate system relative to the PCB, said robot physically manipulating a test apparatus to locate said test apparatus at each of said reduced plurality of nodes to perform diagnostic testing at each of said reduced plurality of nodes; and
    a second processor receiving diagnostic test data from said test apparatus in the form of sample measurements of a plurality of selected testing parameters taken at each of said reduced plurality of node points, said second processor computing a standard deviation and mean for each of said sample measurements for each of said plurality of selected testing parameters and calculating a Coefficient of Variation for each of said plurality of selected testing parameters as a ratio of the standard deviation of a selected testing parameter to the mean for the selected testing parameter, for each node point, said second processor further sorting and ranking each selected testing parameter based on the Coefficient of Variation for each parameter.

11. The apparatus of claim 10 wherein said node point reduction selection criterion include eliminating from testing selected node points including at least one of ground points, voltage points, driver outputs and points associated with discrete components.

12. The apparatus of claim 10 wherein said test apparatus is an oscilloscope probe.

13. The apparatus of claim 10 wherein said diagnostic testing includes measuring selected testing parameters include at least one of rise time, fall time, preshoot, overshoot, base voltage, top voltage, minimum voltage, and maximum voltage.

14. An apparatus for performing data reduction to results of diagnostic testing of signal integrity on a Printed Circuit Board (PCB), comprising:
    means for testing each of a plurality of node points by taking sample measurements of a plurality of selected testing parameters;
    means for computing a standard deviation and mean for each of said sample measurements for each of said plurality of selected testing parameters;
    means for calculating a Coefficient of Variation for each of said plurality of selected testing parameters as a ratio of the standard deviation of a selected testing parameter to the mean for the selected testing parameter, for each node point; and means for sorting and ranking each selected testing parameter based on the Coefficient of Variation for each parameter.

15. The apparatus of claim 14 further including means for performing an initial reduction before testing wherein the quantity of analyzed node points, and a corresponding amount of raw data, are reduced by application of node point reduction selection criterion.

16. The apparatus of claim 15 wherein the plurality of node points are located on a Printed Circuit Board and the initial reduction step involves applying selection criterion that eliminates from testing selected node points including at least one of ground points, voltage points, driver outputs and points associated with discrete components.

17. The apparatus of claim 14 further including means for summing the rank values at each node point of all the plurality of selected testing parameters, then sorting the plurality of selected testing parameters on the basis of summed rank value.

18. The apparatus of claim 17 further including means for entering the sorted and ranked plurality of selected testing parameters into an ordered list with critical node points located at the top of the ordered list.

19. The apparatus of claim 18 wherein the selected testing parameters include at least one of rise time, fall time, preshoot, overshoot, base voltage, top voltage, minimum voltage, and maximum voltage.

* * * * *